United States Patent [19]
Illes et al.

[11] Patent Number: 5,805,610
[45] Date of Patent: Sep. 8, 1998

[54] VIRTUAL CHANNEL DATA DISTRIBUTION SYSTEM FOR INTEGRATED CIRCUIT TESTER

[75] Inventors: Gregory Illes, San Jose; Kenneth L. Skala, Fremont; Richard B. Morris; Duane A. Champoux, both of San Jose, all of Calif.

[73] Assignee: Credence Systems Corporation, Fremont, Calif.

[21] Appl. No.: 848,547

[22] Filed: Apr. 28, 1997

[51] Int. Cl.[6] .................................................. G01R 31/28
[52] U.S. Cl. .................................... 371/27.1; 395/421.07
[58] Field of Search ................................. 371/27.1, 22.6, 371/22.31, 22.1, 27.5; 395/840, 843, 831, 821, 849, 405, 413, 421.07, 421.08, 183.19; 364/481, 579, 580, 490, 489; 324/761, 765

[56] References Cited

U.S. PATENT DOCUMENTS

| | | | |
|---|---|---|---|
| 4,862,067 | 8/1989 | Brune et al. . | |
| 4,931,723 | 6/1990 | Jeffrey et al. . | |
| 4,994,732 | 2/1991 | Jeffrey et al. . | |
| 5,225,772 | 7/1993 | Cheung et al. | 324/158 R |
| 5,461,310 | 10/1995 | Cheung et al. | 324/158.1 |
| 5,497,379 | 3/1996 | Whetsel | 371/22.3 |
| 5,499,248 | 3/1996 | Behrens et al. | 371/22.1 |
| 5,517,666 | 5/1996 | Ohtani et al. | 395/800 |
| 5,613,077 | 3/1997 | Leung et al. | 395/306 |
| 5,659,796 | 8/1997 | Thorson et al. | 395/200.71 |
| 5,673,272 | 9/1997 | Proskauer et al. | 371/22.1 |

*Primary Examiner*—Robert W. Beausoliel, Jr.
*Assistant Examiner*—Nadeem Iqbal
*Attorney, Agent, or Firm*—Smith-Hill and Bedell

[57] ABSTRACT

An integrated circuit tester includes a node for each terminal of a device under test. Each node includes a pin electronics circuit for carrying out test activities at the device terminal and a vector memory system for supplying a vector sequence to the local pin electronics circuit for controlling its test activities. To program the tester, a host computer transmits an appropriate set of vectors to each vector memory system via a common bus. Before sending vectors to the vector memory systems, the host computer sends them control data assigning each to one or more "virtual channels" such that all vector memory systems that are to receive a similar set of vectors are assigned to a similar virtual channel. Also, before transmitting each set of vectors on the bus, the host computer broadcasts additional control data to all vector memory systems designating one virtual channel as active. Thereafter only those vector memory systems assigned to the active virtual channel accept the transmitted vector set. Thus the host computer can concurrently write the same set of vectors to more than one vector memory system when the pin electronics circuits they control are to carry out similar test activities.

12 Claims, 7 Drawing Sheets

VIRTUAL CHANNEL DATA DISTRIBUTION SYSTEM FOR INTEGRATED CIRCUIT TESTER

BACKGROUND OF THE INVENTION

1. Field of the Invention

The present invention relates in general to integrated circuit testers and in particular to system for quickly and efficiently distributing data to circuits controlling test activities at various terminals of an integrated circuit under test.

2. Description of Related Art

An integrated circuit tester applies patterns of logic signals to input terminals of an integrated circuit (IC) and ascertains the resulting output logic signal patterns produced at its output terminals. Testers typically include a separate "pin electronics" circuit for each IC terminal which, during each cycle of a test, can supply an output test signal of some particular pattern to the terminal and/or monitor an IC output signal at the pin during the cycle and store data representing its logic state. The action each pin electronics circuit is to take during a given test cycle is encoded into input data (a "test vector") supplied thereto at the start of the cycle.

Many testers include a separate vector memory system for each pin electronics circuit. Each vector memory system stores all the vectors its associated pin electronics circuit needs for a test and reads them out to the pin electronics circuit during the test. The vector memory systems are all linked to a host computer through a common bus so that the host computer may write test vectors into the vector memory systems before the test. In a large IC tester, the host computer typically must send large numbers of test vectors separately to hundreds of vector memory systems through that common bus. The bandwidth of the bus limits the speed with which a tester can be programmed. What is needed is a system for more rapidly delivering vectors to the vector memories.

SUMMARY OF THE INVENTION

An integrated circuit tester in accordance with the present invention comprises a set of tester nodes, each including a vector memory, a vector memory controller, and a pin electronics circuit. During a test, the vector memory controller of each node reads test vectors out of the vector memory and supplies them sequentially to the pin electronics. Each test vector is encoded to tell the pin electronics circuit how to interact with a terminal of an integrated circuit device under test (DUT) during one cycle of a test. The vector memories are all connected in parallel to a host computer through a common bus. To program the tester to carry out a test, a host computer sends test vectors via a parallel bus to each vector memory controller. Each vector memory controller stores the test vectors it receives in its local vector memory.

Two or more vector memories may store similar sets of vectors. For example in "multi-site" testing, an integrated circuit concurrently carries out the same test on several similar integrated circuits. When the tester has 500 nodes, it can concurrently test ten similar IC's, each having 50 terminals. In such case, while 500 vector memories must be loaded with vectors, only 50 different sets of vectors are needed. Each group of ten vector memories requires the same vector set.

In accordance with the invention, the amount of time needed to load vectors into the vector memories is reduced by allowing a host computer to write similar vector data into more than one vector memory concurrently. To control which memory controller is to store currently transmitted vector data, the host computer writes control data into control registers within each vector memory controller which assigns each vector memory controller to one or more "virtual channels." Before transmitting vectors on the bus, the host computer broadcasts data to all vector memory controllers indicating which virtual channel is to be active. Thereafter, whenever the host computer transmits vectors on the bus, only those vector memory controllers assigned to the active virtual channel store the vectors in their vector memories. The other vector memory controllers do not. In this way the host computer can, when appropriate, concurrently send the same vector data to more than one vector memory controller. The ability to assign vector memory controllers to virtual channels speeds writing of vector data to the vector memories by reducing the number of computer bus write cycles needed to transmit the data to the vector memory controllers.

It is a further object of the invention to provide an IC tester allowing a host computer to rapidly distribute vectors through a common bus to vector memories of an integrated circuit tester.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form an integrated circuit tester in accordance with the present invention, FIG. 2 is a block diagram illustrating a typical vector memory controller of the integrated circuit tester of FIG. 1, FIG. 3 illustrates the register interface circuit and control registers of FIG. 2 in more detailed block diagram form, FIG. 4 is a flow chart depicting in more detail the steps host computer of FIG. 1 carries out when distributing vectors to the vector memory controllers of FIG. 1, FIG. 5 is a block diagram illustrating communications between the cache unload circuit, the read cache array, and the cache load circuit of FIG. 2, FIG. 6 illustrates the cache unload circuit of FIG. 2 in more detailed block diagram form, FIG. 7 illustrates the VCB interface circuit of FIG. 2 in more detailed block diagram form, FIG. 8 illustrates the scan interface circuit of FIG. 2 in more detailed block diagram form, FIG. 9 illustrates the master controller of FIG. 1 in more detailed block diagram form, and FIG. 10 illustrates the scan module of FIG. 1 in more detailed block diagram form.

DESCRIPTION OF THE PREFERRED EMBODIMENT(S)

Tester Architecture

Figure 1:
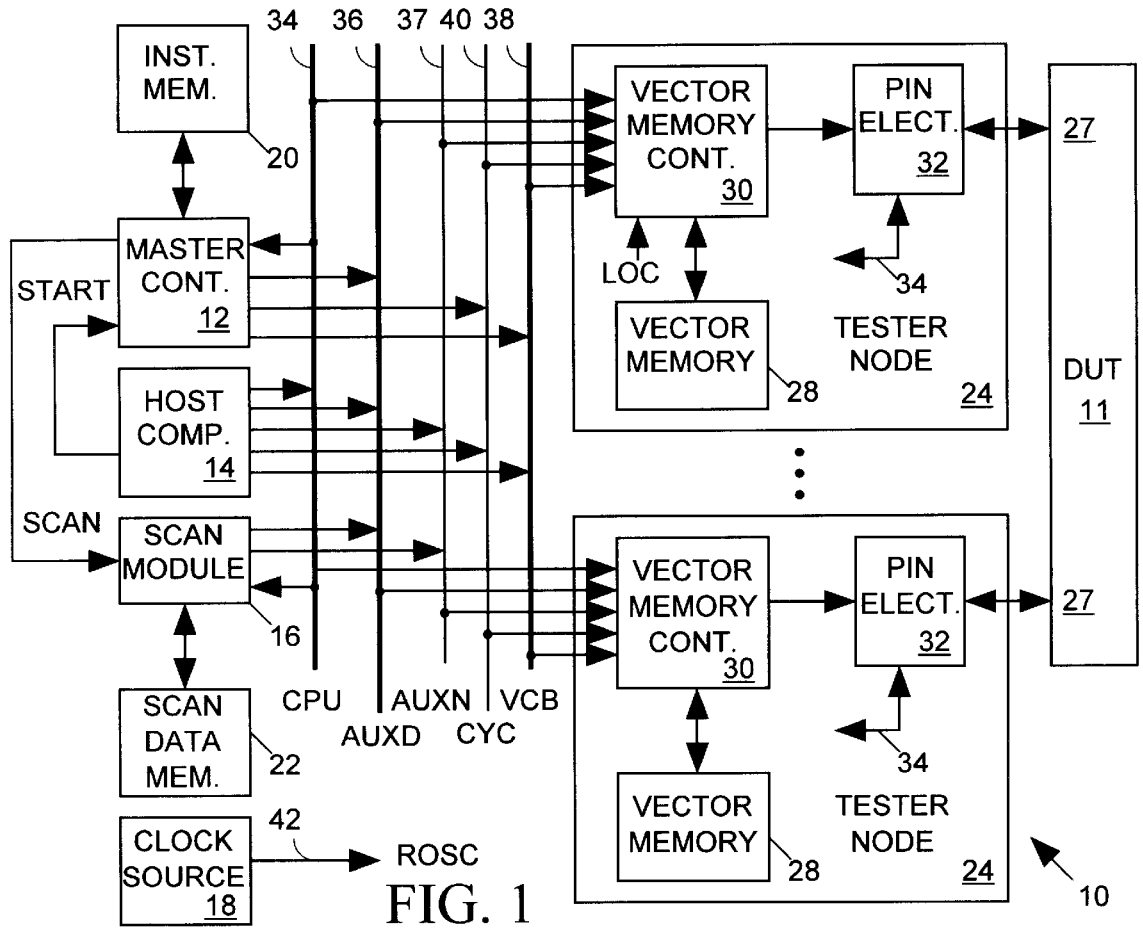

FIG. 1 illustrates in block diagram form an integrated circuit (IC) tester 10 in accordance with the present invention for testing an IC device under test (DUT) 11. (DUT 11 may also be a circuit formed by more than one IC or may be several IC's that are not connected.) At various times during a test, tester 10 may drive an input logic signal to a high or low logic level at any pin or test point (terminal) of DUT 11 or may measure the logic level of a DUT output signal produced at the pin and store test data indicating the measured logic level. The stored test data can be used to gauge the performance of DUT 11.

Tester 10 includes a master controller 12, a host computer 14, a scan module 16, a clock source 18, a vector instruction memory 20, a scan data memory 22 and a set of tester nodes 24. Each tester node 24 is connected to a separate terminal 27 of DUT 11 and includes a random access vector memory 28, a vector memory controller 30 and pin electronics circuit 32. Host computer 14 writes data to addressable registers of master controller 12, scan module 16 and the vector memory controller 30 and pin electronics 32 of each tester node 24 via a conventional CPU bus 34. CPU bus 34 includes a 16-bit parallel data path, a 10-bit address path and various control lines. Scan module 16 is also coupled to each vector memory controller 30 via a 32-bit wide auxiliary data bus 36 (AUXN) and one control line (AUXN). Host computer 14 also uses AUXD bus 36 as an alternate route for distributing data to the vector memory controllers 24, master controller 12 and scan module 16. During a test, master sequencer 12 sends a sequence of instructions to memory controllers 30 using the AUXD bus to convey instruction operands, a 4-bit vector control bus (VCB) 38 to convey instruction opcodes, and a control line (CYC) 40 to signal the memory controllers when an instruction is available on the AUXD and VCB buses. All logic in tester 10 is synchronized to a 100 MHz reference oscillator (ROSC) signal 42 produced by clock source 18. The ROSC signal is supplied to master sequencer 12, host computer 14, scan module 16 and each tester node 24.

System Operation

A test is organized into a set of successive test cycles oriented to the speed of the device-under-test (DUT). Each test cycle lasts a predetermined whole number of cycles of the ROSC clock signal produced by clock source 18. During a test of DUT 11, each pin electronics circuit 32 carries out all required actions at its corresponding DUT terminal 27. A pin electronics circuit 32 may transmit a high or low logic level test signal to a DUT pin ("drive-high" or "drive-low"), may determine whether the voltage of an output signal generated by the DUT is higher or lower than a reference level and store test data indicating the result ("compare-high" or "compare-low"), or may tristate the DUT pin ("don't-care"). An 8-bit input data field (a "test vector") supplied to each pin electronics circuit 32 at the start of each test cycle tells the pin electronics circuit what to do during that test cycle. Four bits of the test vector determine the action(s), and the other 4 bits of the vector select one of 16 timing configurations. The selected timing configuration controls when pin electronics circuit 32 carries out the action during the test cycle. Each pin electronics circuit 32 stores data indicating results of any of its compare-high and compare-low actions in an internal acquisition memory. At the end of the test, host computer 14 reads test results from the acquisition memories within pin electronics circuits 32 via CPU bus 34 and may, for example, provide the data as an output file or process the data in some manner to generate a user display. Pin electronics circuits 32 operating in the manner described herein above are well-known and commonly employed in conventional integrated circuit testers and are therefore not further detailed herein. Also, methods for processing and displaying tester output data are well-known and not further detailed herein.

Thus the actions of the pin electronics circuits 32 during successive test cycles are defined by a sequence of 8-bit test vectors. During a test, the function of all of the other components of tester 10, other than host computer 14, is to supply an appropriate test vector to each pin electronics circuit 32 for each test cycle. Host computer 14 programs other components of tester 10 to produce the appropriate vector sequences, signals the start of a test and processes test results, but does not otherwise take an active role during the test.

The test is defined by vector sequences of a type commonly produced by well-known IC simulator software, the sequences having been processed into a format suitable for programming tester 10 (in the manner described in detail herein below) and delivered to host computer 14. Tester programming data includes sets of test vectors loaded into vector memories 28, instructions loaded into instruction memory 20, "scan" data loaded into scan data memory 22, and control data written into various addressable control registers within vector memory controllers 30.

After loading the appropriate data into memories 20, 22 and 28 and into the various control registers, host computer 14 signals master controller 12 to start the test. Instruction memory 20 stores data for each test cycle at a separate memory address. The data at each instruction memory 20 address includes cycle timing data and an instruction to be sent to the vector memory controllers 30 of all tester nodes 24. The instruction, including a 4-bit opcode carried on the VCB bus and (in some cases) an operand carried on the AUXD bus, tells each vector memory controller 30 how to produce a vector for the test cycle. During each successive test cycle, master controller 12 reads the contents of an instruction memory 20 storage location. After reading the data out of instruction memory 20, master controller 12 pulses the CYC signal. The leading edge of ROSC within the CYC signal tells the vector memory controllers 30 to acquire the instruction on the VCB and AUXD buses.

The cycle timing data stored with the instruction at each instruction memory 20 address indicates a number of cycles of the ROSC clock signal that master controller 12 is to wait before pulsing the CYC signal and reading data at the instruction memory address. Thus the cycle timing data stored at each instruction memory 20 address controls the duration of a corresponding test cycle.

In response to the CYC signal, each vector memory controller 30 acquires the instruction on the VCB and AUXD buses. Each vector memory controller 30 processes the acquired instruction to provide a vector to its associated pin electronics 32 a few test cycles after acquiring the instruction from the master controller 30. An instruction may, for example, tell vector memory controller 30 to supply pin electronics 32 with a particular vector previously read out of its vector memory 28, to simply repeat a last sent vector, or to generate a vector based on scan data previously acquired from scan data memory 22 via scan module 16.

The scan data loaded into scan data memory 22 before a test is distributed to the vector memory controllers 30 at various times during the test. The vector memory controllers 30 store the scan data until it is needed. Scan data is employed during portions of a test in which only a relatively few vectors supplied to pin electronics circuits 32 change state from cycle-to-cycle. This is particularly common when testing integrated circuits having special "scan terminals" for receiving relatively long test patterns while other IC terminals are tristated or held at constant level. For such portions of the test, master controller 12 sends "scan" instructions to the memory controller 30 over the VCB bus. The scan instructions tell some vector memory controllers 30 to continue to send the same vector to their associated pin electronics circuits 32 during successive test cycles and tell other vector memory controllers 30 to generate a vector based on previously received scan configuration data and new scan vector data from scan module 16, distributed via AUXD. By deriving vectors from scan data distributed from centralized scan data memory 22 instead of from vector memories 28, tester 10 reduces the number of vectors host computer 14 must distribute to vector memories 28 before the test.

Tester 10 is designed to minimize the amount of time required to load vectors into relatively low speed, low cost, conventional dynamic random access memories (DRAMS) forming vector memories 28. The vector loading time is of course related to the number of vectors needed to define the test. It is possible for host computer 14 to simply supply a test vector sequence to each vector memory 28 wherein each sequence includes a vector for each cycle of the test. In such case master controller 12 would simply instruct every vector memory controller 30 to read out a next stored vector for each successive cycle of the test. However since tests often extend over many millions of test cycles, each vector memory 28 would have to store many millions of vectors. Although such a mode of operating tester 10 would require use of relatively large vector memories 28, a more troublesome drawback to storing one vector per test cycle in each vector memory 28 is the amount of time needed to write so many vectors into the vector memories. Since DUT 11 may have hundreds of terminals and may require very short test cycles, host computer 14 would have to send an enormous number of vectors to vector memories 30 to define a test lasting only a few seconds. Also the amount of time required to write a vector directly to a memory is a function of the speed of the memory. If we reduce costs by using low speed vector memories, we increase the time required to write vectors directly to those memories.

Tester 10 reduces the amount of time needed to load vectors into vector memories 28 in four ways. First, it reduces the number of vectors needed to control a test by providing vector memory controllers 30 that are capable of re-using portions of the vector sequences stored in the vector memories whenever the test involves repetitive operations at the IC terminals.

Secondly, tester 10 reduces the number of vectors that must be stored in vector memories 28 by providing the alternative, centralized source of test control data (scan data memory 22) during portions of a test in which vectors supplied to only a relatively few pin electronics circuits 32 are changing state.

Thirdly, tester 10 provides a write caching system allowing host computer 14 to supply vectors to nodes 24 at a very high rate, higher than the rate at which it could directly write access the vector memories.

Finally, tester 10 is structured to allow host computer 14 to broadcast data to selected groups of tester nodes 24 when they require similar operations for portions of a test. Thus, for example, if 100 nodes are to carry out the same action during the same test interval, host computer 14 writes the same data concurrently to all 100 nodes, thereby requiring only one bus cycle instead of 100 to deliver data separately to each of the 100 nodes.

As described in more detail below, these four tester features interact symbiotically to provide a tester which can perform high speed tests on DUT 11 while employing relatively low speed vector memories, and yet which allows host computer 14 to rapidly distribute vector data to the vector memories via a relatively compact bus arrangement.

Vector Memory Controller

Figure 2:
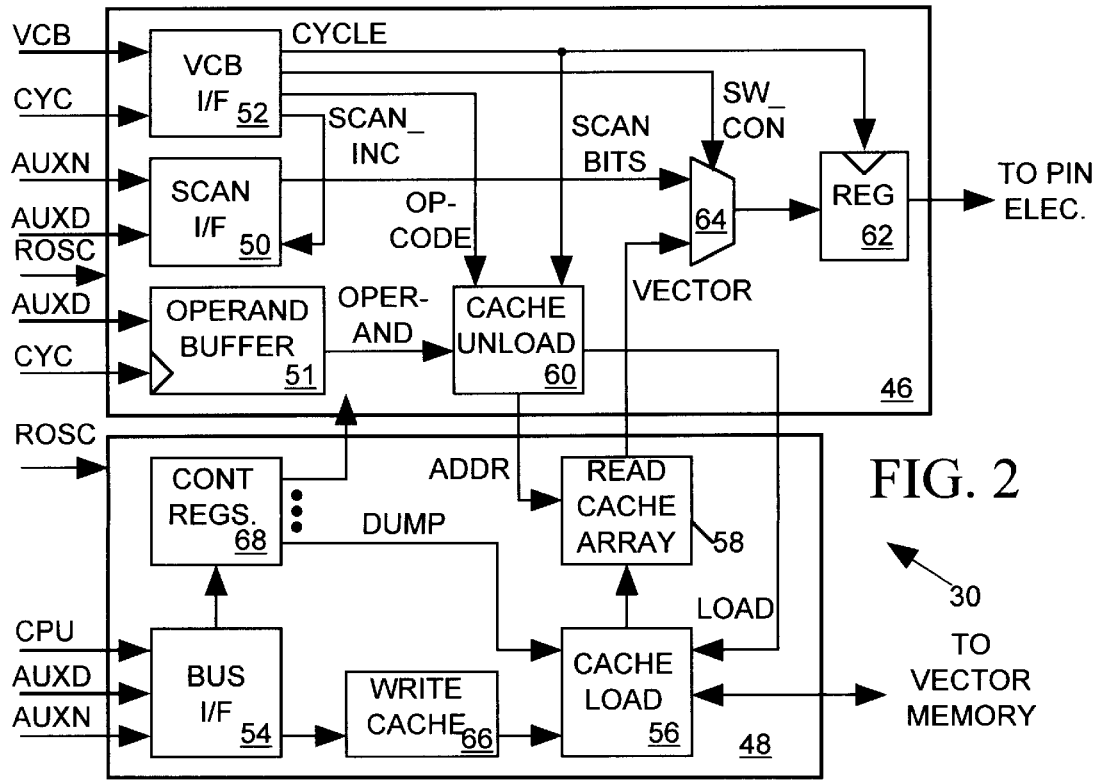

FIG. 2 illustrates a typical vector memory controller 30 of FIG. 1. Referring to FIGS. 1 and 2, vector memory controller 30 includes a vector processing system 46 and a vector storage control system 48. Vector processing system 46 includes a scan interface circuit 50, a VCB interface circuit 52, a cache unload circuit 60, a multiplexer 64 and a register 62. The vector storage control system 48 includes a bus interface circuit 54, a cache load circuit 56, a read cash array 58, a write cache 66, and a set of control registers 68. All logic operations are synchronized to the ROSC clock signal supplied to various logic blocks of FIG. 2.

Referring to both FIGS. 1 and 2, host computer 14 may send data to addressable control registers 68 within vector memory controller 30 over either the CPU bus or the AUXD bus via bus interface circuit 54. The data stored in control registers 68 controls various modes of operation of other blocks of FIG. 2 as described below. Host computer 14 also routes data to bus interface circuit 54 via the AUXD bus if the AUXD data is vector data. Bus interface circuit 54 stores the incoming vectors in addressable registers forming write cache 66. When write cache 66 is fully loaded with a block of 64 vectors, host computer 14 writes a control bit (DUMP) to one of registers 68 telling cache load circuit 56 to transfer the vectors from write cache 66 into the vector memory 28. Cache load circuit 56 writes sixteen 8-bit vectors (128 bits) beginning at each of four MODULO-16 addresses of vector memory 28. While the cache unload circuit 56 is write accessing the relatively slow vector memories 28, host computer 14 may write vectors to other nodes. Thus the rate at which host computer 14 distributes data to the vector memories 28 is not limited by the relatively low access speed of the vector memories themselves but by the relatively high access speed of write caches 66.

During a test, VCB interface circuit 52 receives instruction opcodes on the VCB bus in response to the CYC signal and forwards them to cache unload circuit 60. VCB interface circuit 52 also decodes instructions to provide a control signal (SCAN_INC) to scan interface circuit 50 and a control signal (SW_CON) to multiplexer 64. Also in response to the CYC signal, VCB interface circuit 52 produces a CYCLE signal that marks the start of each test cycle. The CYCLE signal clocks opcodes and operands into cache unload circuit 60 and clocks vectors though output register 62.

During a test, cache load circuit 56 reads blocks of vectors out of vector memory 28 and stores them in read cache array 58. Cache unload circuit 60 reads individual vectors out of cache array 58 and sends them to pin electronics 32 via multiplexer 64 and output register 62. Whenever one of the caches in read cache array 58 becomes selected for new data, cache unload circuit 60 signals cache load circuit 56 to read another block of vectors out of the vector memory and to load it into the selected read cache.

Scan interface circuit 50 receives and stores 32-bit scan data words from scan module 16 via the AUXD bus at various times during a test in response to a pulse on the AUXN control line from scan module 16. During scan cycles, the SCAN_INC signal from VCB interface circuit 52 tells scan interface circuit 50 to deliver some bits of that scan data to multiplexer 64. The particular bits to be forwarded to multiplexer 64 are determined by control data in registers 68. When vector memory controller 30 is serving a scan input, VCB interface circuit 52 switches multiplexer 64 so that it replaces selected bits of the cache unload circuit 60 output vector with scan data bits from scan interface circuit 50. Data written into control registers 68 before the test begins tells VCB interface circuit 52 which bits of the vector are to be replaced.

Register Access

Figure 3:
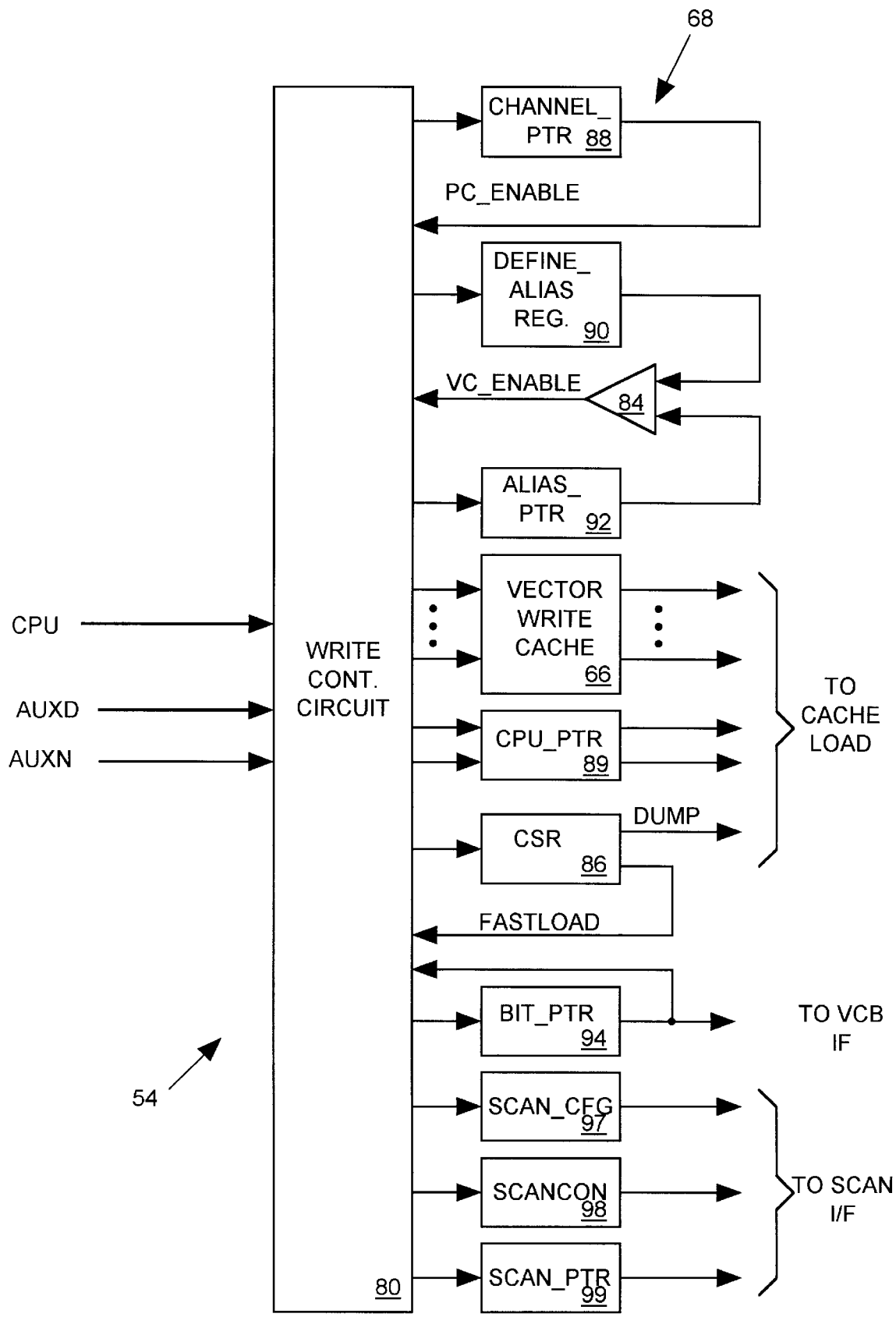

FIG. 3 illustrates bus interface circuit 54 and control registers 68 of FIG. 2 in more detailed block diagram form. Vector write cache 66 of FIG. 2 also appears in FIG. 3. Bus interface circuit 54 includes a write control circuit 80, two comparators 82 and 84 and a multiplexer 86. Write control circuit 80 is actually two conventional write control circuits; one allows host computer 14 to write data to registers via the CPU bus while the other allows host computer 14 to write data to registers via the AUXD bus. The host computer 14 sets a control bit (FASTLOAD) stored in a control status register (CSR) 86 to enable a "fastload" mode of data transmission via the AUXD bus and resets the bit to enable a "CPU mode" of data transmission via the CPU bus.

Corresponding registers within vector memory controllers 30 of the various tester nodes 24 at FIG. 1 have the same bus address. In the CPU mode, host computer 14 may write data to a particular register address in a conventional manner by placing the data and the address on the CPU bus and asserting a CPU bus memory address strobe (MAS) line. In the fastload mode host computer 14 also writes data to a particular register address in a similar manner by placing the data and address on the AUXD bus and asserting the AUXN signal. To shift between CPU and fastload modes, host computer 14 uses the current mode to change the FAST-LOAD bit in the CSR register 86.

Although similar registers within all vector memory controllers 30 have the same bus address, whether a particular write control circuit 80 of any particular vector memory controller 30 actually stores the incoming data in an addressed register depends on the access mode of the addressed register and on the "physical" or "virtual" data channels to which its vector memory controller has been assigned. There are three register access modes, "broadcast", "channel", and "alias". These register access modes, as well as the notions of physical and virtual data channels, are all described below.

Broadcast Mode

Write control circuit 80 treats some of the control registers as "broadcast mode" registers. When host computer 14 transmits data addressed to a broadcast mode register address via the CPU or AUXD bus, all memory controllers 30 store that data in the addressed register. Thus with a single CPU or AUXD bus write operation host computer 14 may write the same data into corresponding broadcast mode registers of all vector memory controllers 30. To broadcast write in the CPU data transmission mode, host computer 14 places the data and a broadcast mode register address on CPU bus 34 and pulses memory address strobe (MAS) lines of the CPU bus 34 leading to every vector memory controller 30. Each bus interface circuit 54 responds to the MAS strobe by storing the data in the addressed register. To broadcast write in the fast load data transmission mode, host computer 14 places data and a broadcast mode register address on the AUXD bus and pulses the AUXN control line. Each bus interface circuit 54 responds to the AUXN control line by storing the data in the addressed register.

Channel mode (Physical Channels)

Even though similar registers within different vector memory controllers 30 have similar bus addresses, host computer 14 can write data to a channel mode register of any one vector memory controller 30 without writing data to similarly addressed channel mode registers of any other vector memory controller. Each memory controller 30 is permanently assigned to a "physical data channel." CPU bus 34 includes a separate memory address strobe line for each memory controller 30.

To perform a channel mode write operation, host computer 14 first activates the desired physical data channel by broadcasting data referencing that channel to a channel_ptr register 88, a broadcast mode register within every vector memory controller 30. When a channel sees its own assigned value and an active MAS, the PC_ENABLE signal is supplied to write control circuit 80. When the PC_ENABLE signal is asserted, write control circuit 80 is enabled to receive any data on the CPU bus. Accordingly, after the PC_ENABLE signal is asserted, host computer 14 places control data and the address of a channel mode register on CPU bus 34 and pulses the MAS line leading to the vector memory controller 30 that is to receive the data.

Alias Mode (Virtual Channels)

Host computer 14 may separately assign each vector memory controller 30 to one of 65,536 "virtual" data channels, each referenced by a unique 16-bit virtual channel code. Host computer 14 can thereafter activate any given virtual channel and then concurrently write data into similarly addressed "alias mode" registers within all the vector memory controllers 30 assigned to the activated virtual channel.

To assign the vector memory controllers 30 to various virtual channels, host computer 14 uses the channel mode to write a 16-bit virtual channel code to the define_alias register 90 within each vector memory controller 30. The code stored in define alias register 90 of a given vector memory controller 30 references a separate virtual channel to which that controller may be assigned. Thereafter host computer 14 broadcasts data to an alias_ptr register 92 in each vector memory controller. That data is delivered to an input of comparator 84. The alias pointer code indicates the virtual channel to which the vector memory controller may respond. Host computer 14 can reassign vector memory controllers to different virtual channels at any time by writing new data to the define alias register 90 within each vector memory controller.

Having assigned each vector memory controller 30 to a virtual channel, host computer 14 may activate any one of those virtual channels by broadcasting a virtual channel code into the alias pointer register 92 of every vector memory controller. When the code stored in register 92 matches any of the vector memory controllers assigned channel code outputs of registers 90, comparator 84 asserts a virtual channel enable signal (VC_ENABLE) supplied to write control circuit 80. When the VC_ENABLE signal is asserted, write control circuit 80 will write data into any addressed virtual channel register in either the CPU or fastload modes. This virtual channel system is particularly useful for allowing host computer 14 to concurrently write data to more than one vector memory controller 30 when they require the same data for the same test configuration.

Vector Distribution

Host computer 14 indirectly writes blocks of 64 8-bit vectors into a vector memory 28 by using the fastload mode of register access to fastload write 32 16-bit data words into the 64×8-bit vector write cache 66 via the AUXD bus. Vector write cache 66 consists of a set of 32 16-bit alias mode registers. Each 16-bit data word appearing on the AUXD bus is sent to one of the 32 vector write cache registers. The first set of four 16-bit words arriving on the AUXD bus contain the first bits of all 64 vectors. Similarly, the nth set of four 16-bit words contain the nth bits of all 64 vectors. Before writing any data into vector write cache 66, host computer 14 writes an address to a pair of cpu_ptr registers 89 and writes an 8-bit word to a bit_ptr register 94. The address in cpu_ptr registers 89 tells cache load circuit 56 (FIG. 2) the starting vector memory address to which data from the vector write cache 66 is to be written. The contents of bit_ptr register 94 tells write control circuit 80 which of the eight vector bits is to be targeted next. Host computer 14 writes new data to bit_pointer register 94 after each set of four write cache accesses. When all 64 vectors have been stored to vector write cache 66, host computer 14 sets a DUMP bit into control status register (csr) 86 to signal cache load circuit 56 to acquire the vectors from write cache 66 and to store them in vector memory 28 starting at the address stored in cpu_ptr registers 89.

Figure 4:
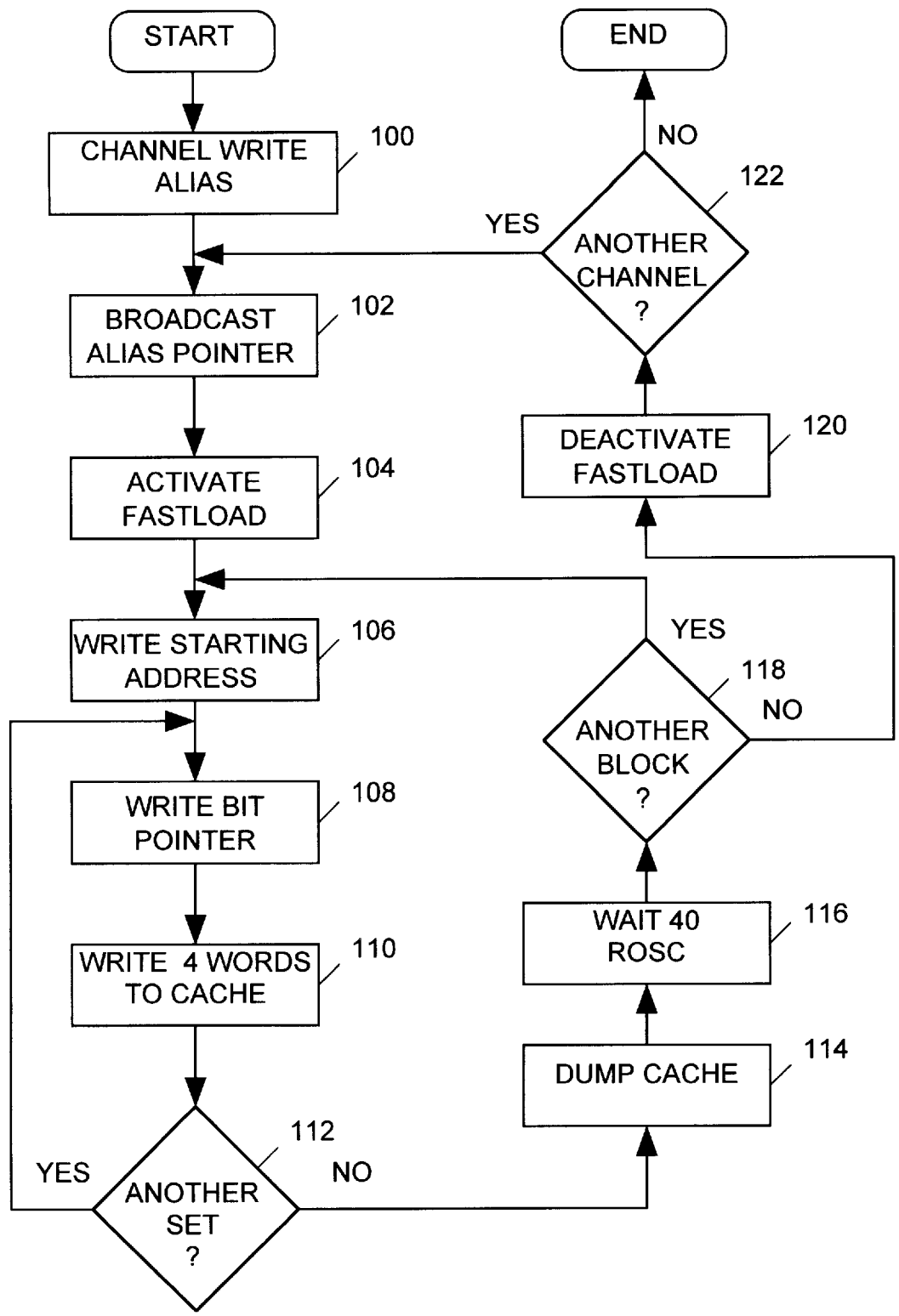

FIG. 4 is a flow chart depicting in more detail the steps host computer 14 carries out when writing vectors into vector memories 28 via the vector memory controller's vector write cache 66. Referring to FIG. 4, host computer 14 first uses the channel mode of register access to write alias definitions into define-alias registers 90 (step 100). It then broadcasts an alias pointer to the alias_ptr register 92 and a channel pointer to the channel_ptr register 88 of all vector memory controllers 30 (step 102). Host computer 14 then writes a fastload code to the CSR register 86 to enable the fastload mode of register access (step 104), and then fastload writes a vector memory starting address into cpu_ptr registers 89 (step 106). Host computer next fastload writes a 0 to bit_ptr register 94 to indicate that the next set of four 16-bit words (which convey the first bits of each of the 64 vectors) are to be stored in the first position in vector write cache 66 (step 108). Thereafter, host computer 14 executes four write operations in succession to send the first four 16-bit words to the vector cache 66 memories (step 110).

Having written the first four 16-bit words to the vector write caches but not having written the entire block of 32 data words to the vector cache (step 112), host computer 14 returns to step 108 to write a new bit pointer into the bit_ptr registers 94 of each vector memory 30 controller of the active virtual channel to indicate that the next set of four 16-bit words contain the second bits of all 64 vectors. Host computer 14 then returns to step 110 to write the second set of four vector pairs into vector write cache 66. Host computer 14 continues to cycle through steps 108–112 until at step 112 it has sent all 64 vectors to the vector write cache 66 of all vector memory controllers 30 assigned to the active virtual channel. At that point host computer 14 writes the DUMP bit to all CSR registers 86 (step 114) to inform the cache load circuits 56 that a block of vectors is available in the write cache for storage in vector memory 28. Each cache load circuit 56 then writes the data into the vector memory and resets the DUMP bit. Host computer waits for 40 cycles of the ROSC clock to allow the cache load circuits 56 sufficient time to write the vector data into the vector memory (step 116). If host computer 14 wishes to send another block of vectors to vector memory controllers 30 of the same virtual channel (step 118), host computer 14 then returns to step 106 to begin writing a next set of vectors into the vector write cache. After completing the last vector write operation for the active virtual channel, host computer 14 writes a code to CSR register 86 to disable the fastload mode of register access (step 120). If host computer 14 now wishes to send vectors to vector memory controllers of another virtual channel (step 122), it may return to step 102. Otherwise, the vector loading process is complete.

Instruction Processing

During a test, VCB interface circuit 52 of FIG. 2 receives the CYC signal from master controller 12 of FIG. 1 and produces an internal CYCLE signal on the leading edge of each ROSC clock signal when enabled by the CYC signal. The CYC signal also tells VCB interface to acquire an instruction opcode from the VCB bus and to begin decoding it to determine how to control multiplexer 64 and scan interface 50. VCB interface 52 also forwards opcodes to cache unload circuit 60.

Figure 5:
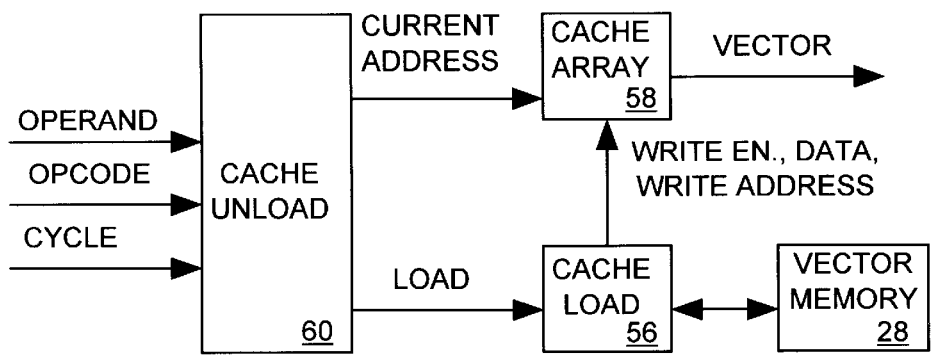

FIG. 5 is a block diagram illustrating communication interconnections between cache unload circuit 60, read cache array 58, and cache load circuit 56 of FIG. 2 in more detail. Cache unload circuit 60 receives instruction opcodes and operands and the CYCLE signal as input. In response to each CYCLE signal pulse, cache unload circuit 60 updates an address (ADDR) supplied as input to read cache array 58. Read cache array 58 returns the vector stored at that current address and cache unload circuit 60 forwards it to multiplexer 64.

Read cache array 58 includes 13 caches, each capable of storing 1024 vectors. Thus cache array 56 may store up to 13,312 vectors. Whenever cache unload circuit 60 starts outputting vectors out of a given cache of array 58, it normally sends a LOAD signal pulse to cache load circuit 56. Cache load circuit 56 remembers the last vector memory 28 address from which it read data and also remembers which cache of read cache array 58 last received that data. Cache load circuit 56 responds to the LOAD signal pulse by reading the data out of the next 64 addresses of vector memory 28 and sequentially sending them to a depleted cache within read cache array 58, supplying the read cache array with the appropriate cache write address and write enable signal. Since the cache unload circuit 60 is not currently accessing that particular cache of array 58, the cache load operation does not interfere with the cache unload operations. Cache load circuit 56 and read cache array 58 are of conventional construction and are not detailed herein.

Referring back to FIG. 2, operand buffer 51 (a FIFO buffer) shifts in any data appearing on the AUXD bus on each pulse of the CYC signal and shifts the data out to cache unload circuit 60 a few CYC signal pulses later. As explained in more detail below, when it places an opcode of an instruction requiring an operand on the VCB, master controller 12 of FIG. 1 also places the operand on the AUXD bus. The operand works its way through operand buffer 51 to reach cache unload circuit 60 at the moment VCB interface circuit 52 has decoded the opcode and has signaled cache unload circuit 60 to carry out the instruction. Cache unload circuit 60 then uses the operand when carrying out the instructions. Most of the data passing through operand buffer 51 to cache unload circuit 60 is of no use to cache unload circuit 60 because most instructions do not require operands. For such instructions, cache unload circuit 60 simply ignores the input from operand buffer 51.

Some instructions tell cache unload circuit 60 to retain vectors in a given portion of read cache array 58 after having read them by refraining from signaling cache unload circuit 56 to write over them. This allows the cache unload circuit 60 to later jump back to a previous point of the vector sequence in read cache array 58 when commanded to do so by a subsequent VCB instruction. Thus cache unload circuit 60 is capable of supporting looping though any subset of vector memory 28 vectors repeatedly. The operation of cache unload circuit 60 and the instructions it processes are described in more detail below.

Scan Instruction Processing

During a test, master controller 12 of FIG. 1 may signal scan module 16 to transmit scan data to the vector memory controllers 30 by sending a SCAN signal pulse to scan module 16. Scan module 16 responds by placing a 32-bit scan data word on the AUXD bus, and then asserting the AUXN signal. Scan interface circuit 50 of FIG. 2 includes an internal FIFO buffer clocked by the ROSC signal and enabled by the AUXN signal. Thus when scan module 16 sends the scan data words out on the AUXD bus and asserts the AUXN signal, the scan interface circuit 50 in every vector memory controller 30 quickly loads the scan data words into its internal FIFO buffer. Although master controller 12 uses the AUXD bus to transmit instruction operands to the vector memory controllers 30 during a test, it does not do so during scan operations. Therefore instruction operands do not end up in the FIFO buffer in scan interface 50.

When VCB interface circuit 52 decodes a SCAN instruction, it signals scan interface circuit 50 to shift its longest stored 32-bit scan data word out of its FIFO buffer. As it does so, scan interface circuit 50 selects one to eight of those 32 bits (as determined by control data in control registers 68) and sends the selected scan data bits to an input of multiplexer 64. The SCAN instruction type also tells cache unload circuit 60 whether to continue to send its current output vector to multiplexer 64 for an additional test cycle or get new data. Multiplexer 64 can replace any bit of the vector from cache unload circuit 60 with a corresponding scan bit from scan interface 50. If control data in registers 68 indicate that the tester node is servicing a scan data input, VCB interface circuit 52 signals multiplexer 64 to replace one or more of the bits of the cache unload circuit 60 output vector with the selected scan bits. The vector bits to be replaced are also determined by control data in registers 68. If the tester node is not servicing a scan terminal, the control data in registers 68 tells VCB interface circuit 52 to set multiplexer 64 to pass the cache load circuit 60 output vector to register 62 unchanged.

Depending on the scan mode selected in registers 68, the 32-bit scan data word is used up 1, 2, 4, 8, 16 or 32 bits at a time for each test cycle. Since all bits are accessible to all controllers 30, each controller can use either identical or unique bits. As each 32-bit word is consumed, a new word is shifted out of the FIFO buffer, and master controller 12 signals scan module 16 to place another 32-bit word on AUXD.

Instruction Set

Master controller 12 transmits one 4-bit instruction opcode to vector memory controllers 30 via the VCB bus for each test cycle. Master controller 12 may concurrently transmit an operand to the vector memory controllers 30 via the AUXD bus along with some opcodes. Each vector in read cache array 58 has a unique address. Cache unload circuit 60 always outputs the vector stored at its current input address. Each instruction tells cache unload 60 which cache address is to be the current cache address during the next test cycle. The instruction set also tells VCB interface circuit 52 whether it is to signal scan interface circuit 50 to provide scan data to multiplexer 64 and (along with control data in registers 68) tells VCB interface circuit 52 whether it is to set multiplexer 64 to insert that scan data into the vector being sent to output register 64. The following is a list of 14 different types of instructions master controller 12 may send to vector memory controllers 30 during a test:

INCR: The INCR instruction tells cache unload circuit 60 to increment the current cache address for the next test cycle.

REPEAT: The REPEAT instruction tells cache unload circuit 60 to hold the current cache address unchanged for the next test cycle.

SCAN: The SCAN instruction tells cache unload interface circuit 60 to hold the current cache address during the test cycle and also tells VCB interface circuit 52 to signal scan interface circuit 50 to supply scan bits to multiplexer 64 during the next test cycle. The scan instruction also tells VCB interface circuit 52 to switch multiplexer 64 to a state indicated by data in one of control registers 68 during the test cycle for which the instruction is intended. If that data indicates that the tester node is servicing a DUT scan terminal, VCB interface circuit 52 will set multiplexer 64 to replace selected bits of the vector output of cache unload circuit 60 with selected scan data bits.

SCANI: The SCANI instruction is similar to the SCAN instruction except that it tells cache unload circuit 60 to increment the current cache address.

CACHEGI: The CACHEGI instruction includes an operand delivered via operand buffer 51 to cache unload circuit 60 at the same time the instruction opcode is delivered to cache unload circuit 60 via VCB interface circuit 52. Like the INCR instruction, the CACHEGI instruction signals cache unload circuit 60 to increment the current cache address. However, the CACHEGI instruction also tells cache unload circuit 60 to flag a particular cache address indicated by the operand as a "goto" address. When a cache address is flagged as a "goto" address, cache load circuit 56 loads a dedicated "goto" cache set in read cache array 58 with the vector memory contents pointed to by the CACHEGI operand. Time is inserted before the next test cycle to allow this transaction to occur.

GOTO: The GOTO instruction tells cache unload circuit 60 to make the cache address flagged by a previous CACHEGI instruction its current cache address.

CACHECI: The CACHECI instruction tells cache unload circuit 60 to advance to a next cache address and, at the same time, to flag a cache address referenced by the instruction operand as a "call" address. When a cache address is flagged as a call address, cache load circuit 56 loads a dedicated "call" cache set in read cache array 58 with the vector memory contents pointed to by the CACHEGI operand. Time is inserted before the next test cycle to allow this transaction to occur.

CALL: The CALL instruction tells the cache unload circuit 60 to flag the next address as a "return" address and begins using data from the dedicated call cache set, with no time delay. Additional space is made within the call cache to allow data to be accessed and cached for a subsequent "return" operation, it then begins using data from the dedicated goto cache set, with no time delay.

RETURN: The RETURN instruction tells cache unload circuit 60 to jump to the address following the call address, and to un-flag the return cache so that it may subsequently be re-used.

LOOP1: First occurrences of a LOOP1 instruction tell cache unload circuit 60 to flag the current cache as a "loop1" cache and then to increment the cache address. When a cache is flagged as the loop 1 cache, cache unload circuit 60 refrains from signaling cache load circuit 56 to write new data into the loop1 cache. A second occurrence of the loop1 instruction, without an intervening loop01 instruction, tells cache unload circuit 60 to un-flag the loop1 cache so that it may thereafter be re-used.

LOOP01: The LOOP01 instruction tells cache unload circuit 60 to return to the loop1 address in the loop1 cache and to output the vector stored there.

LOOP2: First occurrences of a loop2 instruction tell cache unload circuit 60 to flag the current cache as a "loop2" cache and then to increment the current cache address. When a cache is flagged as the loop2 cache, cache unload circuit 60 refrains from signaling cache load circuit 56 to write new data into the loop2 cache. A second occurrence of the loop2 instruction, without an intervening loop02 instruction, tells cache unload circuit 60 to un-flag the loop2 cache.

LOOP02: The loop02 instruction tells cache unload circuit 60 to return to the loop2 address in the loop2 cache and to output the vector stored there.

DGOTO: The dgoto instruction tells cache unload circuit 60 to make the cache address conveyed by the current input operand the current address and to output the vector stored there. This action requires a delay to obtain the new data from vector memory 28.

Cache Unload Circuit

Figure 6:
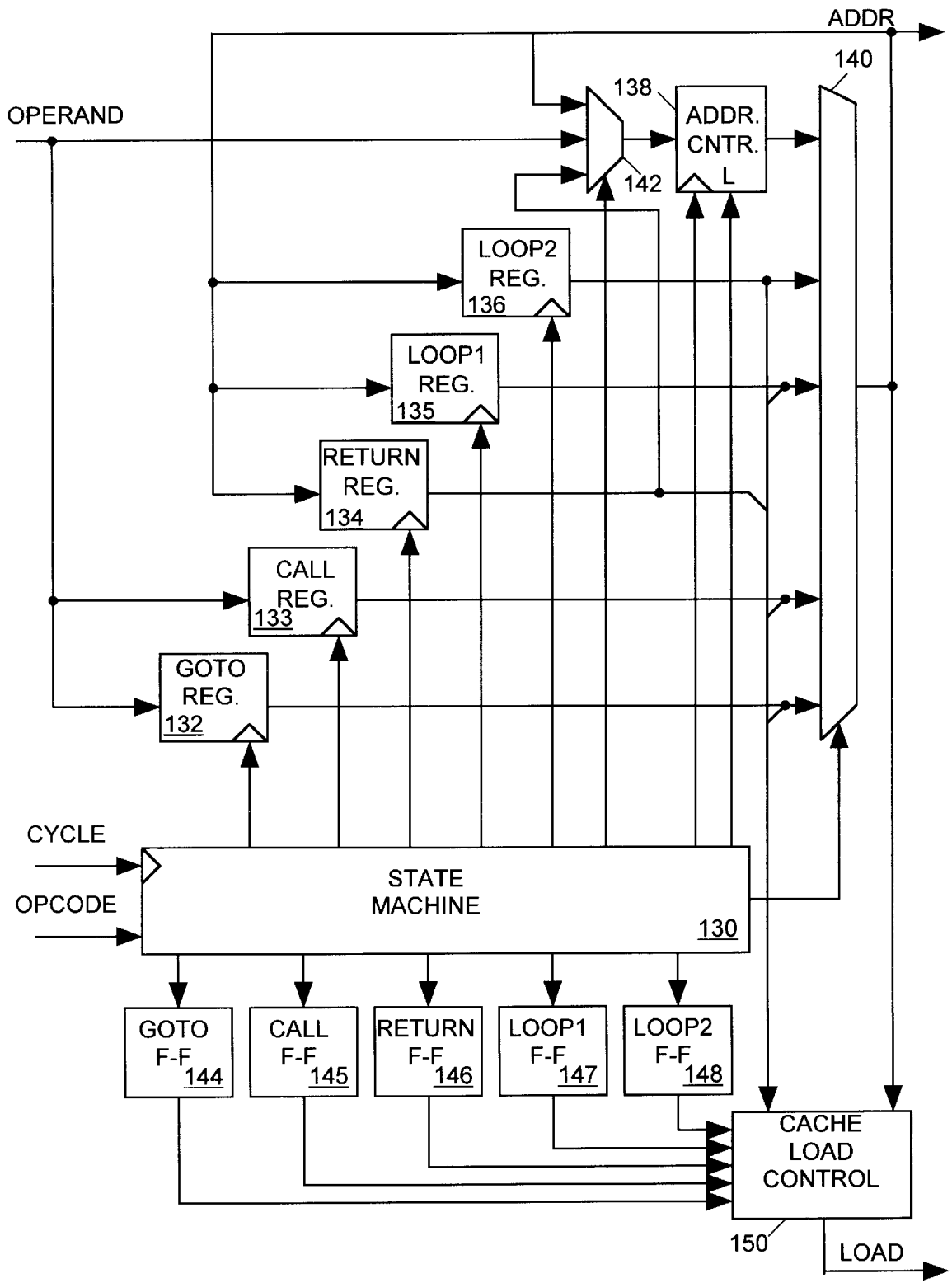

FIG. 6 illustrates cache unload circuit 60 of FIG. 2 in more detailed block diagram form. Cache unload circuit 60 includes a state machine 130 clocked by the CYCLE signal for receiving and processing the 4-bit instruction opcode. The operand from operand buffer 51 of FIG. 2 is supplied as input to a set of registers 132–133 enabled by state machine 130. The current internal vector memory address is supplied as input to registers 134–136. Register 132 stores the goto address, register 133 stores the call address, register 134 stores the return address, register 135 stores the loop1 address and register 136 stores the loop2 address. The output of an address counter 138, clocked by state machine 130, and the contents of all registers 132, 133, 135 and 136 provide inputs to a multiplexer 140, controlled by state machine 130. Multiplexer 140 selects one of its inputs as the current cache array input address ADDR. Another multiplexer 142, also controlled by state machine 130, selectively delivers either the current address, the output of return register 134, or the operand as input to address counter 138. State machine 130 can signal counter 138 to load the output of multiplexer 142. A set of flip-flops 144–148, respectively, store goto, call, return loop1 and loop2 flags. State machine 130 sets and resets flip-flops 142–148 to set and reset the flags.

A cache load control circuit 150 includes a state machine and a set of comparators. Cache load control circuit 150 compares the current address output of multiplexer 140 to the starting addresses of the 13 caches to determine when the current address has passed through an array boundary. Cache load control circuit 150 also monitors the current contents of registers 132 and the state of flip-flops 144–148 to determine which of the 13 caches contain an active return, loop1 or loop2 address. Normally when the current address vacates a cache, cache load control circuit 150 pulses the LOAD signal, telling the cache load circuit to free up the vacated cache. However if the vacated cache contains an active return, loop1 or loop2 address, cache load control circuit 150 delays asserting the LOAD pulse until state machine 130 resets the associated flip-flop 144–148.

State machine 130 responds to each input instruction opcode as follows:

INCR: State machine 130 sets multiplexer 140 to select the output of address counter 138 and clocks counter 138 so that it increments the current address.

REPEAT: State machine 130 takes no action; the current address remains unchanged.

SCAN: State machine 130 takes no action; the current address remains unchanged.

SCANI: State machine 130 sets multiplexer 140 to select the output of address counter 138 and clocks counter 138 so that it increments the current address.

CACHEGI: State machine 130 clocks the operand into goto register 132, sets multiplexer 140 to select the output of address counter, and clocks counter 138.

GOTO: State machine 130 sets multiplexer 140 to select the output of goto register 132 as the current address, sets multiplexer 142 to select the current address as input to address counter 138, loads that current address into address counter 138 and sets goto flip-flop 144.

CACHECI: State machine 130 clocks the operand into call register 133, sets multiplexer 140 to select the output of address counter 138, and clocks counter 138.

CALL: State machine 130 sets multiplexer 140 to select the output of call register 133, sets multiplexer 142 to select the current address as input to address counter 138, loads that current address into address counter 138, clocks counter 138, loads the operand into return register 134, sets call flip-flop 145 and sets return flip-flop 146.

RETURN: State machine 130 sets multiplexer 140 to select the output of address counter 138, sets multiplexer 142 to select the output of return register 134, loads that current address into address counter 138 and increments its count, and resets return flip-flop 146.

LOOP1: On first occurrences of the LOOP1 instruction state machine 130 sets the loop1 flip-flop 147, loads the current address into loop 1 register 135, increments the count in address counter 138 and signals multiplexer 140 to select the output of counter 138 as the current address. On second occurrences of the LOOP1 instruction, without an intervening loop01 instruction, state machine 130 resets the loop1 flip-flop, increments the count in address counter 138 and signals multiplexer to select the output of multiplexer 140.

LOOP01: State machine 130 signals multiplexer 140 to select the output of loop1 register 135.

LOOP2: On first occurrences of the LOOP2 instruction state machine 130 sets the loop2 flip-flop 148, loads the current address into loop2 register 136, increments the count in address counter 138 and signals multiplexer 140 to select the output of counter 138 as the current address. On second occurrences of the LOOP2 instruction, without an intervening loop02 instruction, state machine 130 resets the loop2 flip-flop, increments the count in address counter 138 and signals multiplexer to select the output of multiplexer 140.

LOOP02: State machine 130 signals multiplexer 140 to select the output of loop2 register 136.

DGOTO: State machine signal multiplexer 142 to pass the operand to counter 138, signals the counter to load the operand, and signals multiplexer 140 to select the output of counter 138. A time delay is created to allow accessing new data from vector memory 28.

VCB Interface Circuit

Figure 7:
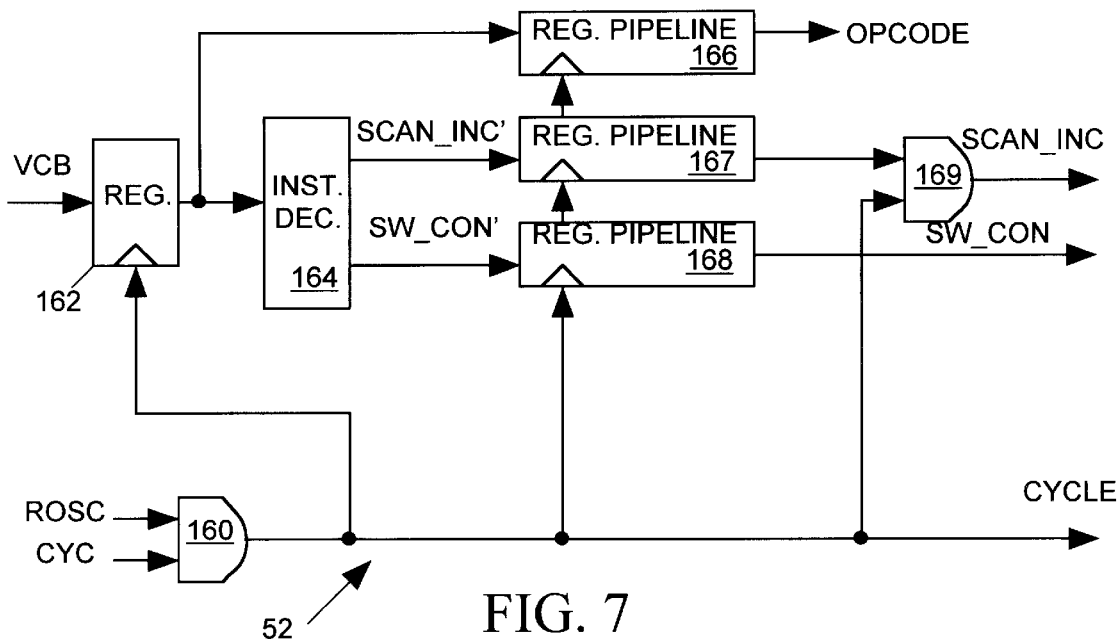

FIG. 7 illustrates VCB interface circuit 52 of FIG. 2 in more detailed block diagram form. VCB interface circuit 52 includes an AND gate 160 receiving the ROSC and CYC clock signals as inputs and producing the CYCLE signal as output. Each leading edge of the CYCLE signal indicates the start of a test cycle. The CYCLE signal clocks a register 162 storing the instruction opcode arriving on the VCB bus. An instruction decoder 164 decodes the opcode stored in register 162 to produce two control signals SW_CON' and SCAN_INC'. The opcode stored in register 162 and the two decoder output signals SCAN_INC' and SW_CON' pass through separate register pipelines 166–168, respectively, clocked by the CYCLE signal. The opcode output of pipeline 166 is sent to cache unload circuit 60 of FIG. 1. An AND gate 169 ANDs the SCAN_INC' signal output of pipeline 167 with the CYCLE signal to produce a SCAN_INC signal for signaling scan interface 50 of FIG. 2 to produce scan data output. The SW_CON output of register pipeline 168 controls output multiplexer 64 of FIG. 2.

When an incoming instruction is other than a SCAN instruction, decoder 164 sets the SW_CON' signal so that output multiplexer 64 (FIG. 2) selects only the vector output of cache unload circuit 60. When an incoming instruction is a SCAN instruction, decoder 164 produces a SW_CON' that makes output multiplexer 64 select scan data.

The number of stages within the various register pipelines 166–168 in FIG. 7 and the number of states in operand buffer 51 of FIG. 2 are separately adjusted to account for differences in processing times of cache load circuit 60, scan interface circuit 50 and multiplexer 64. This ensures that the vector data from cache unload circuit 60, the scan data from scan interface 50 and the control signal SW_CON resulting from the same instruction all arrive concurrently at output multiplexer 64 during the test cycle immediately preceding the test cycle to be controlled by the instruction.

Scan Interface Circuit

Figure 8:
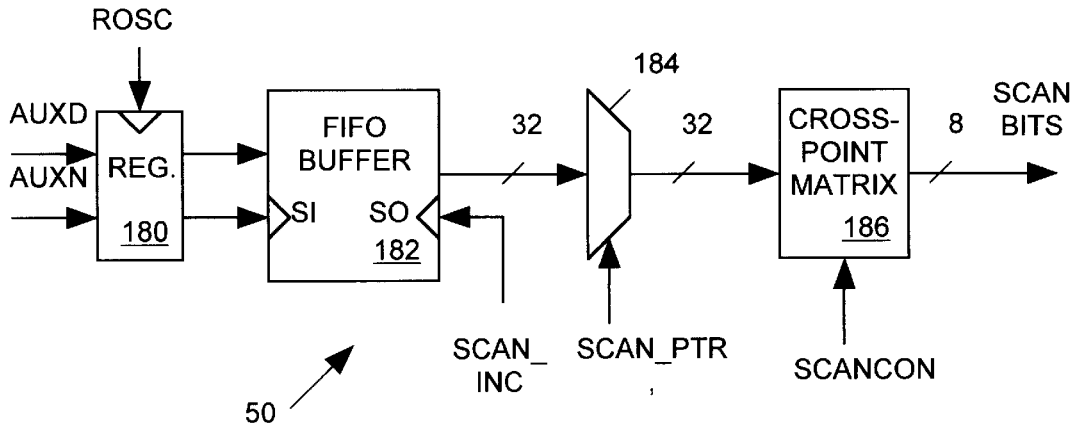

FIG. 8 illustrates scan interface circuit 50 of FIG. 2 in more detailed block diagram form. Scan interface circuit 50 includes a register 180 clocked by the ROSC signal for receiving and storing 32-bit scan data words appearing on the AUXD bus as well as a control bit conveyed by the AUXN signal. The AUXN bit stored in register 180 with the AUXD data in register 180 shifts the AUXD data in register 180 into a FIFO buffer 182. In response to each pulse of the SCAN_INC signal from VCB interface circuit 52 of FIG. 2, FIFO buffer 182 shifts out a 32-bit scan data word to the input of a reconfigurable multiplexer 184. The host computer can configure multiplexer 184 as a 1:1, 1:2, 1:4, 1:8, 1:16 or 1:32 multiplexer by storing appropriate SCAN_CFG data in the scan_config control register 97 of FIG. 3. The particular set of 1, 2, 4, 8, 16 or 32 of its input bits selected by multiplexer 184 is controlled by SCAN_PTR data the host computer stores in scan_ptr register 99 of FIG. 3 before the test begins. Thus multiplexer 184 can select any set of 1, 2, 4, 8, 16 or 32 bits of its input 32-bit scan data word and replicate them as necessary to form an output 32-bit word. A 32×8 crosspoint matrix 186, controlled by the SCANCON data stored in control register 98 of FIG. 3, selects and arranges 8 of those bits into the scan bits supplied to output multiplexer 64 of FIG. 2. During a SCAN cycle, output multiplexer 64 may replace one or more bits of the cache unload circuit 60 output vector with corresponding scan bits.

Master Controller

Figure 9:
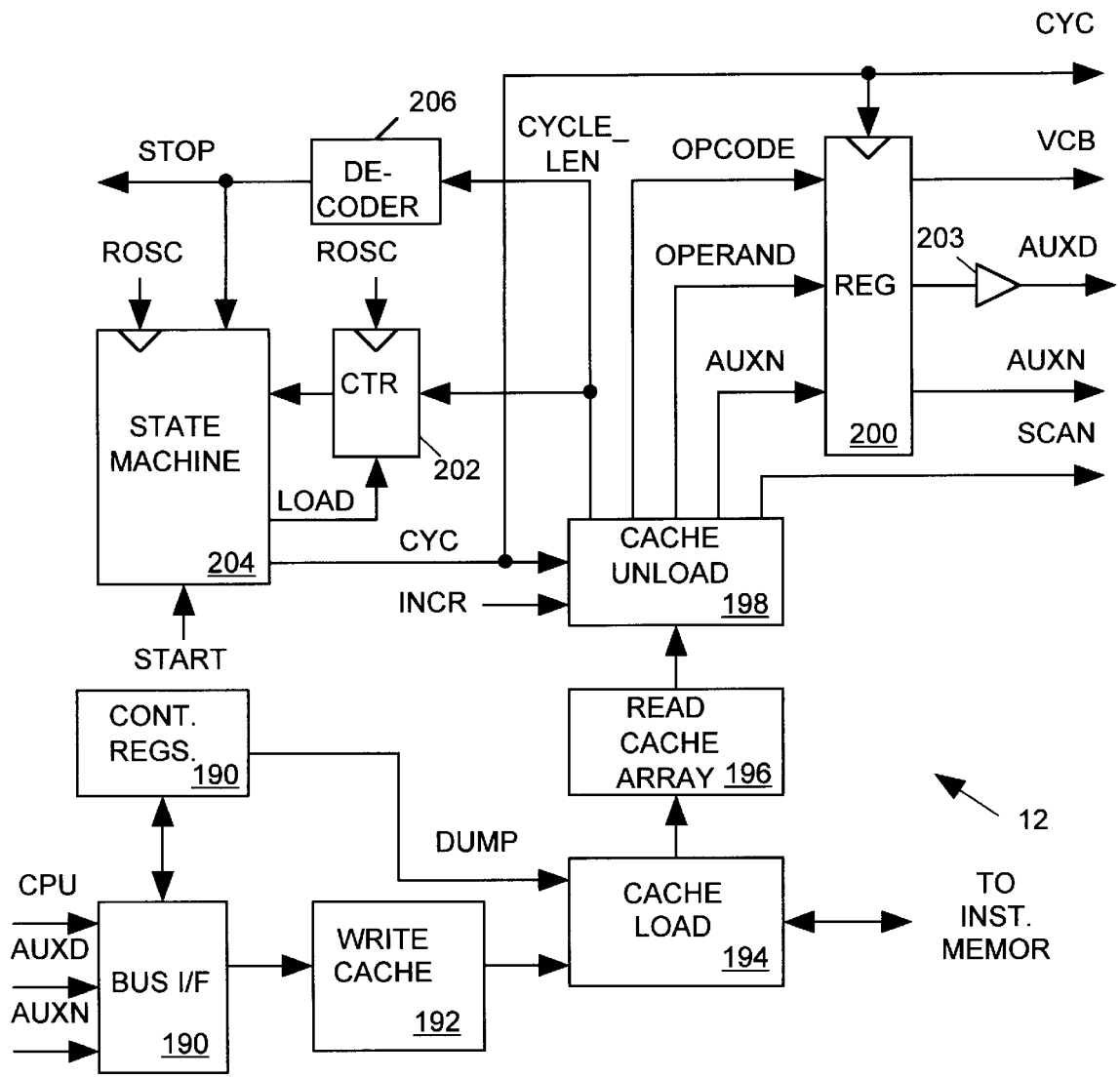

FIG. 9 illustrates master controller 12 of FIG. 1 in more detailed block diagram form. Master controller 12 of FIG. 9 has much in common with vector memory controller 30 of FIG. 2. Whereas the vector memory controller 30 receives a sequence of vectors from host computer 14 via the AUXD bus and stores it in vector memory 28, master controller 12 receives a sequence of vector instructions via the AUXD bus and stores it in instruction memory 20. Comparing FIG. 9 to FIG. 2, master controller 12 includes a bus interface circuit 190, an instruction write cache 192, a cache load circuit 194, an instruction read cache array 196 and a cache unload circuit 198 and control registers 199, generally similar to similarly named components of vector memory controller 30 of FIG. 2.

Host computer 14 assigns master controller 12 to a virtual channel and employs the fastload/alias mode of register access to write instructions into instruction write cache 192 of master controller 12 in substantially the same manner it writes vectors into vector write cache 66 of vector memory controller 30. Cache load circuit 56, read cache array 58 and cache unload circuit 60 are similar in nature and operation to corresponding circuits of vector memory controller 30.

The output bits produced by cache unload circuit 198 for each test cycle include an instruction's 4-bit opcode and (when required) its 32-bit operand. Other data also stored and produced as output with the opcode and operand include a 10-bit CYCLE_LEN data value, an AUXN bit and a SCAN bit. The CYCLE_LEN data indicates the length of the test cycle in number of ROSC clock signal pulses. The AUXN bit is set when the master controller determines that a new AUXD field is required for scan operations. The SCAN bit is set to indicate that master controller 12 is to send a SCAN signal pulse to SCAN module 16 of FIG. 1 to initiate a scan data transfer during the next test cycle.

The opcode, operand and AUXN bit output of cache unload circuit 198 are supplied as inputs to an output register 200 enabled by the CYC signal. An opcode stored in register 200 appears on the VCB bus. The operand stored in register 200 passes to the AUXD bus through a tristate buffer 203 controlled by the master controller/scan logic. Master controller 12 takes control of the AUXD bus only when it is currently transmitting an instruction requiring an operand. Otherwise the AUXD bus is available for use during a test by scan module 16 of FIG. 1. As previously discussed scan module 16 sends a 32-bit scan data word to the operand buffer 31 (FIG. 2) of each vector memory controller 30. Thus host computer 14 may set the SCAN bit stored with an instruction in instruction memory 20 whenever that instruction does not require an operand and the AUXD will not be used for carrying an operand while that instruction is placed on the VCB bus.

The CYCLE_LEN data value stored and appearing with each instruction at the output of cache unload circuit 198 provides an input to a counter 202 clocked by the ROSC signal. In response to a START signal pulse from host computer 12, a state machine 204 transmits a sequence of CYC pulses to cache unload circuit 198 causing it to signal cache load circuit 194 to begin loading read cache array 196 and to obtain an output data from read cache array 196 when it is available. At that point, state machine 204 pulses a load input of counter 202 to load the current CYCLE_LEN output of cache unload circuit 198 into counter 202. State machine 204 also pulses the CYC signal at the same time, causing cache unload circuit 198 to output a next instruction. After loading the CYCLE_LEN data, counter 202 counts ROSC signal pulses down from the CYCLE_LEN value and signals state machine 204 when the count reaches 0. At that point state machine 204 once again concurrently pulses the counter load signal and the CYC signal to load a next CYCLE_LEN value into counter 202 and to tell cache unload circuit 18 to produce output data for the next test cycle. This process continues for each cycle of the test. A decoder 206 sends a STOP signal to reset state machine 204 when a "0" CYCLE_LEN appears at the output of cache unload circuit 198 at the end of the test behind the last instruction. When reset, state machine 204 waits until it receives another START signal pulse. The STOP signal also signals host computer 14 that the test is complete.

Scan Module

Figure 10:
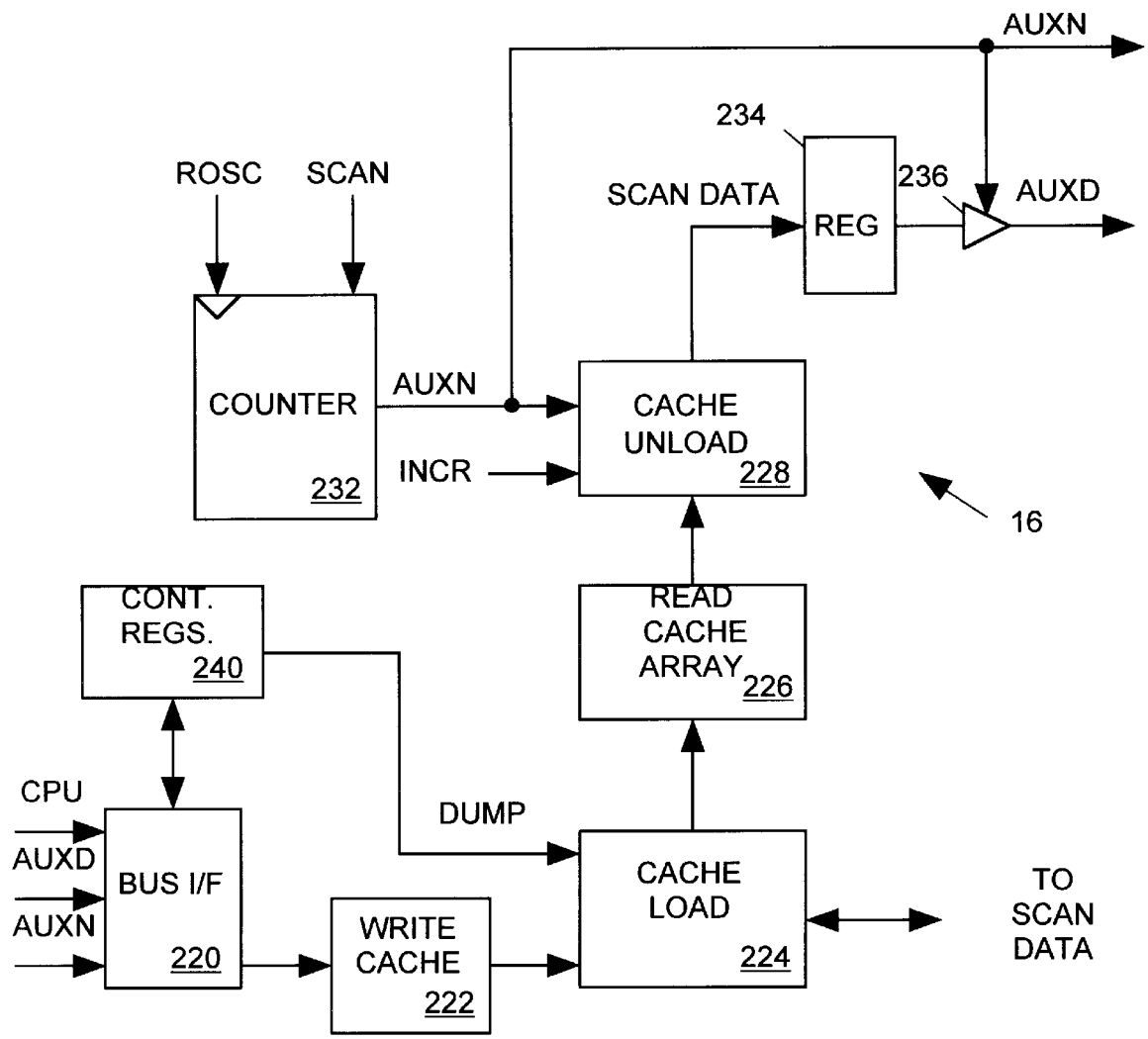

FIG. 10 illustrates scan module 16 of FIG. 1 in more detailed block diagram form. Scan module 16 is also somewhat similar to vector memory controller 30. Scan module 16 stores a 32-bit scan data word at each address of scan data memory 16. During a test, whenever it receives a SCAN signal pulse from master controller 12, it places a scan data word on the AUXD bus and pulses the AUXN signal. Scan module 16 includes a bus interface circuit 220, a write cache 222, a cache load circuit 224, a read cache array 226, a cache unload circuit 228, and control registers 240 generally similar in nature and operation to similarly named components of vector memory controller 30 of FIG. 2. Host computer 14 writes scan data into write cache 222 in the same way it writes vector data into the write caches of the vector memory controllers. Cache load circuit 224 moves data from the write cache 222 into scan data memory 22 and moves data from scan data memory 22 into scan data cache array 226 in the same way cache load circuit 56 of FIG. 2 moves vectors from write cache 66, to vector memory 28 and from vector memory 28 to cache array 58. However cache unload circuit reads 32-bit scan data words out of cache array 226 instead of 8-bit vectors. Cache unload circuit sends the scan data to an output register 234. When enabled by the SCAN signal from master controller 12, counter 232 produces a AUXN pulse. Each AUXN pulse loads a hard-wired INCR instruction into cache unload circuit 228, telling it to acquire a next 32-bit SCAN DATA word from cache array 226 and supply it to output register 234. The AUXN pulse is also driven out along with AUXD data, to qualify AUXD as valid at its destinations. A tristate buffer, enabled by the AUXN signal, delivers the scan data contents of register 234 to the AUXD bus.

Thus it may be seen that tester 10 of FIG. 1 includes a number of interrelated features working symbiotically to enable the tester to employ relatively little amounts of wiring between tester nodes and relatively low speed vector memories at the nodes, and yet deliver programming data to each node quickly and perform high speed tests despite the low read and write access speed of the vector memories. The read and write caches compensate for vector memory access speed limitations. The rate of vector data distribution is further enhanced by aliasing the write caches to provide sets of virtual channels though which the host computer may distribute vectors to multiple tester nodes concurrently rather than sequentially. The large read cache array in combination with the use of a centralized source of vector processing instructions also enables the cache unload circuits to re-use sequences of vector instructions read out of the vector memories, thereby reducing the number of vectors that must be distributed to the nodes. Finally, the use of the centralized source of instructions, in combination with the centralized source of scan data also enables the tester to further reduce the number of vectors that must be distributed to the tester nodes.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for distributing data sequences to a plurality of memories, the apparatus comprising:
   a bus for receiving and conveying virtual channel assignment data, virtual channel selection data and said data sequences; and
   a plurality of bus interface means connected to said bus, each bus interface means corresponding to a separate one of said memories, each bus interface means receiving said virtual channel assignment data, said virtual channel selection data and said data sequences conveyed on said bus, wherein said virtual channel assignment data assigns each bus interface means to one of a plurality of virtual channels, wherein said virtual channel selection data designates one of said virtual channels as an activated virtual channel, and wherein each bus interface means stores any data sequence transmitted in its corresponding memory only when said bus interface means is assigned to the activated virtual channel.

2. The apparatus in accordance with claim 1 wherein said virtual channel assignment data assigns more than one of said bus interface means to the same virtual channel.

3. The apparatus in accordance with claim 1 wherein said virtual channel assignment data includes alias data for assigning a plurality of aliases to each bus interface means, each alias referencing one of said virtual channels, and wherein said virtual channel assignment data also includes alias pointer data for assigning each bus interface means to a particular one of the virtual channels referenced by its aliases.

4. An apparatus for performing a test of a circuit having a plurality of terminals, the apparatus comprising:
   a bus;
   means for transmitting, virtual channel assignment data, virtual channel selection data and a vector sequence on said bus before said test; and
   a write cache for storing vectors before said test, a plurality of nodes, each providing test access to a separate terminal of said circuit for carrying out a sequence of actions at the terminal in response to vectors stored therein before said test, each node receiving said virtual channel assignment data, virtual channel selection data and vector sequence transmitted on said bus before said test, wherein said virtual channel assignment data assigns said node to one of a plurality of virtual channels, wherein said virtual channel selection data designates one of said virtual channels as an activated virtual channel, and wherein said node stores the vector sequence transmitted in said write cache only when said virtual channel assignment data has assigned said node to the activated virtual channel.

5. The apparatus in accordance with claim 4 wherein said virtual channel assignment data assigns more than one of said nodes to the same virtual channel.

6. The apparatus in accordance with claim 4 wherein said virtual channel assignment data includes alias data for a plurality of aliases to each node, each alias referencing one of said virtual channels, and wherein said virtual channel assignment data also includes alias pointer data for assigning each node to a particular one of the virtual channels referenced by said aliases.

7. An apparatus for performing a test of a circuit having a plurality of terminals, the apparatus comprising:
   a bus;
   means for transmitting, virtual channel assignment data, virtual channel selection data and a vector sequence on said bus before said test; and
   a plurality of nodes, each providing test access to a separate terminal of said circuit for carrying out a sequence of actions at the terminal in response to a sequence of vectors, each node comprising:
   a write cache for storing vectors before said test,
   bus interface means for receiving said virtual channel assignment data, virtual channel selection data and vector sequence transmitted on said bus before said test, wherein said virtual channel assignment data assigns said bus interface means to one of a plurality of virtual channels, wherein said virtual channel selection data designates one of said virtual channels as an activated virtual channel, and wherein said bus interface means stores the vector sequence transmitted in said write cache only when said virtual channel assignment data has assigned said bus interface means to the activated virtual channel.

8. The apparatus in accordance with claim 7 further comprising:
   a vector memory for storing vectors; and
   memory load means for reading vectors out of said write cache and storing them in said vector memory before said test.

9. The apparatus in accordance with claim 8 further comprising means for reading vectors out of said vector memory during said test and carrying out said sequence of actions in response thereto.

10. The apparatus in accordance with claim 8 further comprising:
    a read cache for storing vectors during the test;
    means for reading vectors out of said vector memory during said test and storing them in read cache; and
    means for reading said vectors out of said cache array during said test and carrying out said sequence of actions in response thereto.

11. A method for distributing data to a plurality of memory systems interconnected by a bus comprising the steps of:
    sending first control data to each memory system via said bus, the first control data separately assigning each vector memory system to at least one of a plurality of virtual channels,
    broadcasting second control data to all vector memory systems identifying one of said plurality of virtual channels as an active virtual channel, and
    transmitting data concurrently to all memory systems via said bus, wherein only those memory systems assigned to the active virtual channel receive and store the transmitted data.

12. In a circuit tester of the type including a plurality of nodes, each including a pin electronics circuit for carrying out test activities at a separate terminal of a circuit device under test and a vector memory system for supplying a vector sequence to the pin electronics circuit for controlling its test activities at said separate terminal, and bus for delivering vectors to the vector memory system of all nodes in parallel, a method for transmitting vectors to each vector memory system comprising the steps of:
    sending first control data to each vector memory system via said bus, the first control data separately assigning each vector memory system to at least one of a plurality of virtual channels,
    broadcasting second control data to all vector memory systems identifying one of said plurality of virtual channels as an active virtual channel, and
    transmitting vectors concurrently to all vector memory systems via said bus, wherein only those vector memory systems assigned to the active virtual channel receive the transmitted vectors and thereafter supply them to pin electronics circuits during a test of said circuit device under test.

* * * * *